PLURAL DIODE AND CAPACITOR PANELBOARD SYSTEM

Filed Aug. 30, 1961

Inventors
Hatsuaki Fukui
Takehiko Matsushima by Hill, Sherman, Meroni, Gross & Simpson Attys United States Patent Office 3,105,922
Patented Oct. 1, 1963

3,105,922

PLURAL DIODE AND CAPACITOR PANEL-BOARD SYSTEM

Hatsuaki Fukui and Takehiko Matsushima, both of Tokyo, Japan, assignors to Sony Corporation, Tokyo, Japan, a corporation of Japan Filed Aug. 30, 1961, Ser. No. 135,069
Claims priority, application Japan Sept. 5, 1960
11 Claims. (Cl. 317—101)

This invention relates to tunnel diodes and, more particularly, to means for mounting two or more tunnel diodes (commonly referred to as the Esaki diode).

It is an object of this invention to provide means whereby a pair of tunnel diodes may be connected in series in a circuit.

It is another object of this invention to provide means whereby a pair of tunnel diodes having different characteristics may be connected in series in such a manner that the different characteristics are balanced.

It is another object of this invention to provide means whereby a pair of tunnel diodes may be assembled on a base plate with variable capacitors connected in parallel with the diodes, the variable capacitors being easily adjusted to bring the characteristics of the diodes into balance.

It is still another object of this invention to provide means whereby a pair of tunnel diodes may be connected in series and easily adjusted after they are connected in an electronic apparatus.

These and other objects, features and advantages of this invention will become more apparent from the following detailed description taken in conjunction with the accompanying figures of the drawing, in which.

Figure 1:
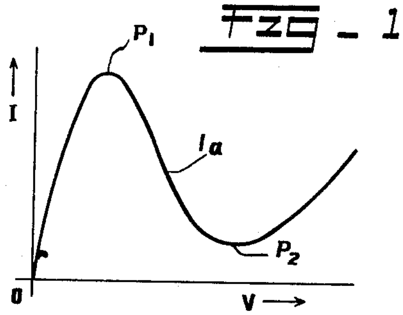
FIGURE 1 is a characteristic curve of a tunnel diode employed in this invention.

A tunnel diode is a semiconductor diode which inherently possesses a distinctive negative resistance characteristic over a range of forwardly applied voltages as exemplified by curve $1_a$ of FIGURE 1. The negative resistance portion of the curve lies between the maximum point $P_1$ and the minimum point $P_2$ for over this range the current decreases as the voltage increases. Advantage is taken of this negative resistance characteristic for when biased into the negative resistance region (or into the positive resistance region in the vicinity of the maximum point $P_1$) a tunnel diode can be utilized for an amplifier, oscillator, amplitude limiter, frequency converter or the like. Because of the high effective transit time of a charge carrier from one side of the tunnel junction to the other (sometimes referred to as resulting from quantum mechanical tunnelling), the tunnel diode is particularly useful as a high frequency device.

Tunnel diodes may be applied to logic circuits of an electronic computer for use as a high velocity element. In such a logic circuit, various systems are known, and a tunnel diode pair which is composed of two tunnel diodes connected in series having substantially equal voltage-current characteristics, may be constructed as a fundamental element. Since systems employing tunnel diode pairs are well known, a detailed explanation will be omitted from this specification.

However, when two diodes are used as a pair, it is important that their characteristics be exactly equal to each other. This is a very difficult requirement to satisfy sufficiently when manufacturing tunnel diodes. Accordingly, it is a primary purpose of this invention to provide a structure whereby a pair of tunnel diodes having unbalanced characteristics may be compensated for.

Figure 2:
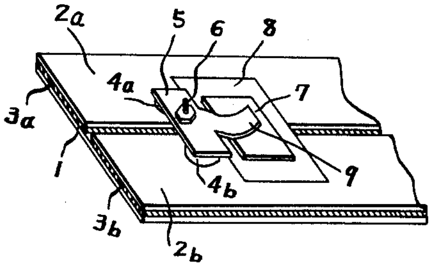
FIGURE 2 is an enlarged perspective view illustrating means for mounting a pair of tunnel diodes constructed in accordance with this invention.

FIGURE 2 of the drawings illustrates one embodiment of the invention. Two conductive strips $2_a$ and $2_b$ are arranged opposite to one face of a plane conducting plate 1, and two dielectric or insulating layers $3_a$ and $3_b$ are interposed between the conductive plate 1 and the two conductive strips $2_a$ and $2_b$. Two tunnel diodes $4_a$ and $4_b$ are mounted on the two strips $2_a$ and $2_b$, respectively, and are electrically connected to each other. These two diodes are arranged in reverse polarity and are bridged by a bridge conductive plate 5. The conductive plate 1 and the bridge conductive plate 5 may be assembled by a bolt-nut structure 6 which is made of an insulating material.

A conductive plate 7 which is electrically connected to the bridge conductive plate 5 is disposed opposite to the surface of one or both conductive strips $2_a$ and $2_b$, and a dielectric or insulating layer 8 is interposed between the conductive plate 7 and the strips $2_a$ and $2_b$. A flexible tongue 9 which projects from the bridge conductive plate 5 serves to press the conductive plate 7 against the insulating layer 8 and the conductive strips $2_a$ and $2_b$.

Figure 3:
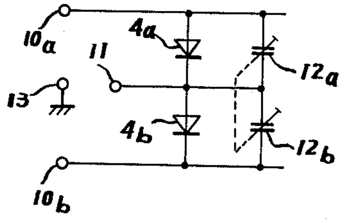
FIGURE 3 is an equivalent circuit diagram illustrating the connections to the pair of tunnel diodes.

FIGURE 3 is an electrical circuit diagram illustrating the connections to the two tunnel diodes. The two conductive strips $2_a$ and $2_b$ form the terminals $10_a$ and $10_b$, respectively, which are connected to the two tunnel diodes $4_a$ and $4_b$ which are connected in series. The conductive plate 1 forms a ground terminal 13. The bridge conductive plate 5 forms a terminal 11 and is the electrical conducting link between the two tunnel diodes $4_a$ and $4_b$. Between the two conductive strips $2_a$ and $2_b$ and the conductive plate 7, which is electrically connected to the bridge conductive plate 5, are formed two capacitors $12_a$ and $12_b$ which are connected in parallel with the two diodes $4_a$ and $4_b$, respectively.

It can be seen that by making the conductive plate 7 adjustable relative to the two strips $2_a$ and $2_b$, the two capacitors $12_a$ and $12_b$ are made variable. To make the value of the capacitor $12_a$ greater and the capacitor $12_b$ less, the plate 7 is shifted in the direction of the strip $2_a$ so that a greater relative area of the plate 7 is placed over the strip $2_a$ and less area is placed over the strip $2_b$. Accordingly, even if the two diodes $4_a$ and $4_b$ have unbalanced characteristics relative to each other, a balanced diode pair can be formed by adjusting the position of the plate 7 relative to the two strips $2_a$ and $2_b$ in order to adjust the magnitudes of the two capacitors $12_a$ and $12_b$.

Figure 4:
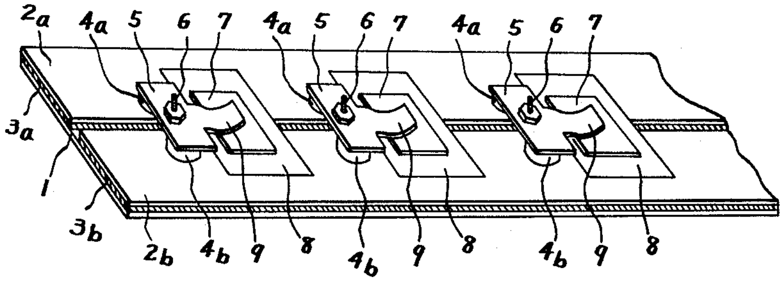
FIGURE 4 is an enlarged perspective view illustrating an embodiment of this invention wherein a plurality of pairs of tunnel diodes are mounted.
Figure 5:
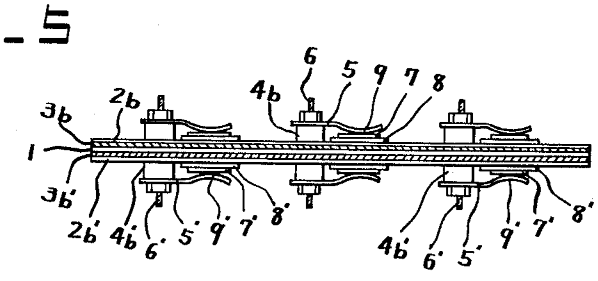
FIGURE 5 is an enlarged side view of the construction illustrated in FIGURE 4.

The foregoing discussion relates to an embodiment of the invention where one pair of diodes is employed. In practice, however, a plurality of diode pairs may be formed as shown in FIGURE 4. In FIGURE 5 is illustrated an embodiment wherein additional pairs of diodes are mounted on the underside of the conductive plate 1. Of course, the bolt and nut combination 6 should be formed of an insulating material.

It is apparent that the flexible tongue 9 can be designed to act as the movable plate 7 in the above embodiments. In this embodiment of the invention the plate 7 could be removed and the flexible tongue 9 made large enough to cover a portion of both of the conductive strips $2_a$ and $2_b$.

It is apparent that modifications and variations may be effected without departing from the scope of the novel concepts of this invention.

What is claimed is:

1. A tunnel diode pair comprising a pair of conductive strips which are juxtaposed but insulated with each other, a pair of tunnel diodes each being disposed on one of said conductive strips with reverse polarity, a bridging conductive plate bridging across said diodes, an insulating layer laid on said conductive strips, and a conductive plate which is electrically connected to said bridging conductive plate and which is laid on said insulating layer.

2. A tunnel diode pair comprising a base insulating plate, a pair of conductive strips juxtaposed on said base insulating plate, a pair of tunnel diodes each being disposed on one of said conductive strips with reverse polarity, a bridging conductive plate bridging across said diode pair, an insulating layer laid on said conductive strips, a conductive plate which is laid on said insulating layer and opposite surfaces of both of said conductive strips through said insulating layer, and means for elastically pressing said conductive plate so as to slidably move said conductive plate and adjust the capacities formed between said conductive plate and said conductive strips.

3. An electronic apparatus comprising first and second tunnel diodes, first and second electrically conductive strips which are juxtaposed and insulated from each other, said first and second diodes being disposed on said first and second strips, respectively, with reverse polarity, a bridging conductive plate bridging across said diodes, and means electrically connected to said bridging plate which extends over said first and second strips, the position of said means being adjustable so that the capacities formed between said means and said strips are adjustable.

4. Apparatus for mounting at least two diodes comprising first and second strips made of an electrically conductive material, said first and second strips being juxtaposed and insulated from each other, a bridging plate formed of an electrically conductive material, means for coupling said bridging plate to said first and second strips, said bridging plate being coupled to said strips in such a manner that first and second diodes may be disposed between said bridging plate and said first and second strips and held thereby, and means electrically coupled to said bridging plate which is adapted to extend over portions of said first and second strips, a capacitive effect being produced thereby.

5. Apparatus for mounting at least two diodes comprising first and second conductive strips which are juxtaposed and insulated from each other, a bridging plate made of a conductive material adjustably coupled to said first and second strips, means electrically connected to said bridging plate which extends over portions of said first and second strips, said bridging plate and said first and second strips being adapted to receive at least first and second diodes therebetween.

6. Apparatus for mounting at least two diodes comprising first and second conductive strips, a bridging plate mechanically coupled to said first and second strips, a layer of insulating material disposed over a surface of said first and second conducting strips adjacent said bridging member, a conductive plate disposed over said layer of insulating material and being electrically separated from said first and second strips by said layer of insulating material, and means formed on said bridging plate for adjustably urging said conductive plate against said layer of insulating material and said first and second strips, said bridging plate and said first and second strips being adapted to receive first and second diodes therebetween.

7. Apparatus for mounting at least two diodes comprising first and second electrically conductive strips which are juxtaposed and insulated from each other, first and second diodes disposed on said first and second strips, respectively, with reverse polarity, a bridging conductive plate mechanically coupled to said first and second strips and insulated therefrom and which electrically connects said first and second diodes in series, and means electrically connected to said bridging plate which extends over said first and second strips and produces a capacitive effect thereby.

8. Apparatus for mounting at least two diodes comprising first and second electrically conductive strips which are juxtaposed and insulated from each other, at least first and second diodes disposed on said first and second strips, respectively, with reverse polarity, a bridging plate mechanically coupled to said first and second strips and insulated therefrom which bears against said first and second diodes and electrically connects said first and second diodes in series, a layer of insulating material disposed over said first and second strips adjacent said bridging plate, a conductive plate disposed on said layer of insulating material, and means formed on said bridging plate which electrically connects said bridging plate to said conductive plate and forces said conductive plate against said layer of insulating material and said first and second strips.

9. Apparatus for mounting a plurality of pairs of diodes comprising a base plate, first and second electrically conductive strips mounted on a first side of said base plate which are juxtaposed and insulated from each other, third and fourth electrically conductive strips which are disposed on the opposite side of said base plate and which are juxtaposed and insulated from each other, at least first and second diodes disposed on each side of said base plate, a bridging conductive plate disposed on each side of said base plate over said first and second diodes on each side of said base plate, and means on each side of said base plate electrically connected to said bridging plate which forms a capacitive effect with said conductive strips.

10. Apparatus for mounting at least two diodes comprising a base insulating plate, first and second electrically conductive strips juxtaposed on said base insulating plate, first and second diodes disposed on said first and second strips, respectively, with reverse polarity, a bridging conductive plate coupled to said base insulating plate and extending over said first and second diodes, an insulating layer disposed on said conductive strips, a conductive plate disposed on said insulating layer and over surfaces of said first and second strips, and means for electrically connecting said conductive plate to said bridging conductive plate and elastically pressing said conductive plate against said first and second strips in such a manner that said conductive plate can be adjusted in position relative to said first and second strips in order to adjust the capacities formed between said conductive strips and said conductive plate.

11. Apparatus for mounting at least two diodes comprising a base conducting plate, first and second electrically conductive strips juxtaposed on said base conducting plate through insulating plates respectively, first and second diodes disposed on said first and second strips, respectively, with reverse polarity, a bridging conductive plate coupled to said base conducting plate and extending over said first and second diodes, an insulating layer disposed on said conductive strips, a conductive plate disposed on said insulating layer and over surfaces of said first and second strips, and means for electrically connecting said conductive plate to said bridging conductive plate and elastically pressing said conductive plate against said first and second strips in such a manner that said conductive plate can be adjusted in position relative to said first and second strips in order to adjust the capacities formed between said conductive strips and said conductive plate.

No references cited.